United States Patent [19]
Ansel et al.

[11] Patent Number: 6,078,637
[45] Date of Patent: Jun. 20, 2000

[54] ADDRESS COUNTER TEST MODE FOR MEMORY DEVICE

[75] Inventors: George M. Ansel; David R. Lindley, both of Starkville; Jeffrey W. Gossett, Columbus; Junfei Fan, MS State, all of Miss.; Andrew L. Hawkins, San Jose; Michael D. Carlson, Livermore, both of Calif.

[73] Assignee: Cypress Semiconductor Corp., San Jose, Calif.

[21] Appl. No.: 09/106,500

[22] Filed: Jun. 29, 1998

[51] Int. Cl.[7] ................................. G06M 3/00
[52] U.S. Cl. ................ 377/26; 377/19; 377/116; 365/236
[58] Field of Search ................ 377/19, 26, 116, 377/45; 365/236

[56] References Cited

U.S. PATENT DOCUMENTS 5,479,466 12/1995 Kim ........................................... 377/45
5,799,053 8/1998 Park ........................................... 377/26

*Primary Examiner*—Margaret R. Wambach
*Attorney, Agent, or Firm*—Christopher P. Maiorana, P.C.

[57] ABSTRACT

A memory having a circuit including a built-in address counter with a test mode. The address counter may be used to generate the memory array addressing for the different array test patterns. The circuit may comprise a logic circuit and a counter circuit. The logic circuit may be configured to generate one or more control signals in response to one or more control inputs. The counter circuit may be configured to generate a first counter output and a second counter output in response to (i) the control outputs and (ii) one or more inputs. The counter may comprise a first portion configured to generate the first counter output and a second portion configured to generate the second counter output.

16 Claims, 3 Drawing Sheets

ADDRESS COUNTER TEST MODE FOR MEMORY DEVICE

FIELD OF THE INVENTION

The present invention relates to memory devices generally and, more particularly, to an address counter test mode for a memory device.

BACKGROUND OF THE INVENTION

When testing a memory device, it is generally necessary to test several different memory array patterns on a RAM device to ensure correct functionality. Each memory array pattern requires a large number of test vectors. Memory testers typically have specialized logic that is used to generate the memory array test patterns automatically, with very little vector memory requirement. General purpose logic testers (e.g., those used for testing dual-port SRAMs or embedded SRAMs) typically do not have the test capability to provide the number of test patterns required. As a result, a large memory on the tester device may be required to test the memory array. By implementing the vectors on the memory of the tester device, long test times may be required (generally caused by the additional time needed to load more than one vector data block to the tester) or expensive vector memory expansion may be required. A pseudo-random address generator is sometimes used to reduce the memory overhead or test time. However, a pseudo-random address generator does not give full coverage of all required memory array addressing sequences.

Conventional approaches to testing memories may include (i) built-in address counters in the memory device being tested allow cycling through all addresses in a linear sequence, (ii) memory testers used to generate array patterns and (iii) additional memory that may be added to logic testers to enable larger vector sets without the need to reload vectors during testing, however the additional memory adds expense to the tester device.

SUMMARY OF THE INVENTION

The present invention concerns a memory having a circuit including a built-in address counter with a test mode. The address counter may be used to generate the memory array addressing for the different array test patterns. The circuit may comprise a logic circuit and a counter circuit. The logic circuit may be configured to generate one or more control signals in response to one or more control inputs. The counter circuit may be configured to generate a first counter output and a second counter output in response to (i) the control outputs and (ii) one or more inputs. The counter may comprise a first portion configured to generate the first counter output and a second portion configured to generate the second counter output.

A second aspect of the present invention concerns a circuit comprising a memory element, a first gate circuit, and an increment circuit. The memory element may be configured to generate a counter output in response to (i) a clock input and (ii) a first input. The first circuit may be configured to present the first input in response to (i) a control input and (ii) an increment input. The increment circuit may be configured to present the increment input in response to the counter output.

The objects, features and advantages of the present invention include providing a memory array having a built-in address generator that may assert a test mode to generate a number of address sequences for testing the array without a speed penalty and using a minimum of chip real estate.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
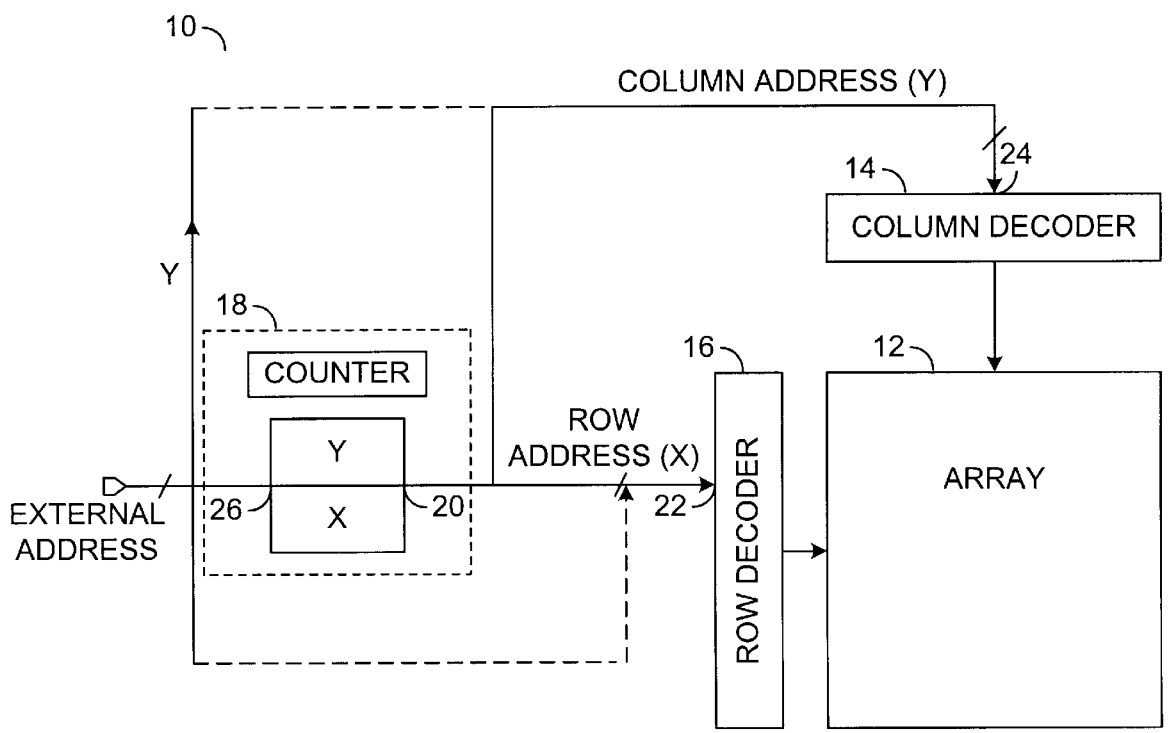
FIG. 1 is a block diagram of a memory array illustrating an implementation of a preferred embodiment of the present invention.

Referring to FIG. 1, a block diagram of a circuit 10 is shown in accordance with the preferred embodiment of the present invention. The circuit 10 generally comprises a memory array 12, a column decoder 14, a row decoder 16, and an address counter 18. The address counter 18 may be divided into an X and a Y counter, where the X counter may be implemented to provide a row address signal and the Y counter may be implemented to provide a column address signal. The counter 18 may have an output 20 that presents the row address signal (e.g., X) to an input 22 of the row decoder 16 and a column address signal (e.g., Y) to an input 24 of the column decoder 14. During a first mode of operation (e.g., a "normal" mode), an external address may be presented to the input 24 of the column decoder 14, the input 22 of the row decoder 16, and an input 26 of the counter 18. The external address or the counter 18 may provide read and write address signals to the column decoder 14 and the row decoder 16 when in the normal mode. When in a second mode of operation (e.g., a "test" mode), the counter 18 may override the external addresses in order to provide test patterns to the column decoder 14 and the row decoder 16. While in the test mode, the counter 18 may continue to generate the test patterns until the test mode is exited. The details of operation of entering and exiting the test mode are described in more detail in connection with FIGS. 2–4.

When in the normal mode, the X and Y sections of the counter 18 may be configured as a single counter with the X section being the least significant bits (LSBs) of the counter 18 and the Y section being the most significant bits (MSBs). Alternatively, the X section may be used as the MSBs and the Y section may be used as the LSBs. When in the test mode, the X and Y sections of the counter 18 operate independently to provide the various test patterns, such as X-fast and Y-fast patterns. The counter 18 may also generate incremental changes in both the X and Y portions of the counter on a single clock pulse, which may accomplish a diagonal memory array test pattern.

Figure 2:
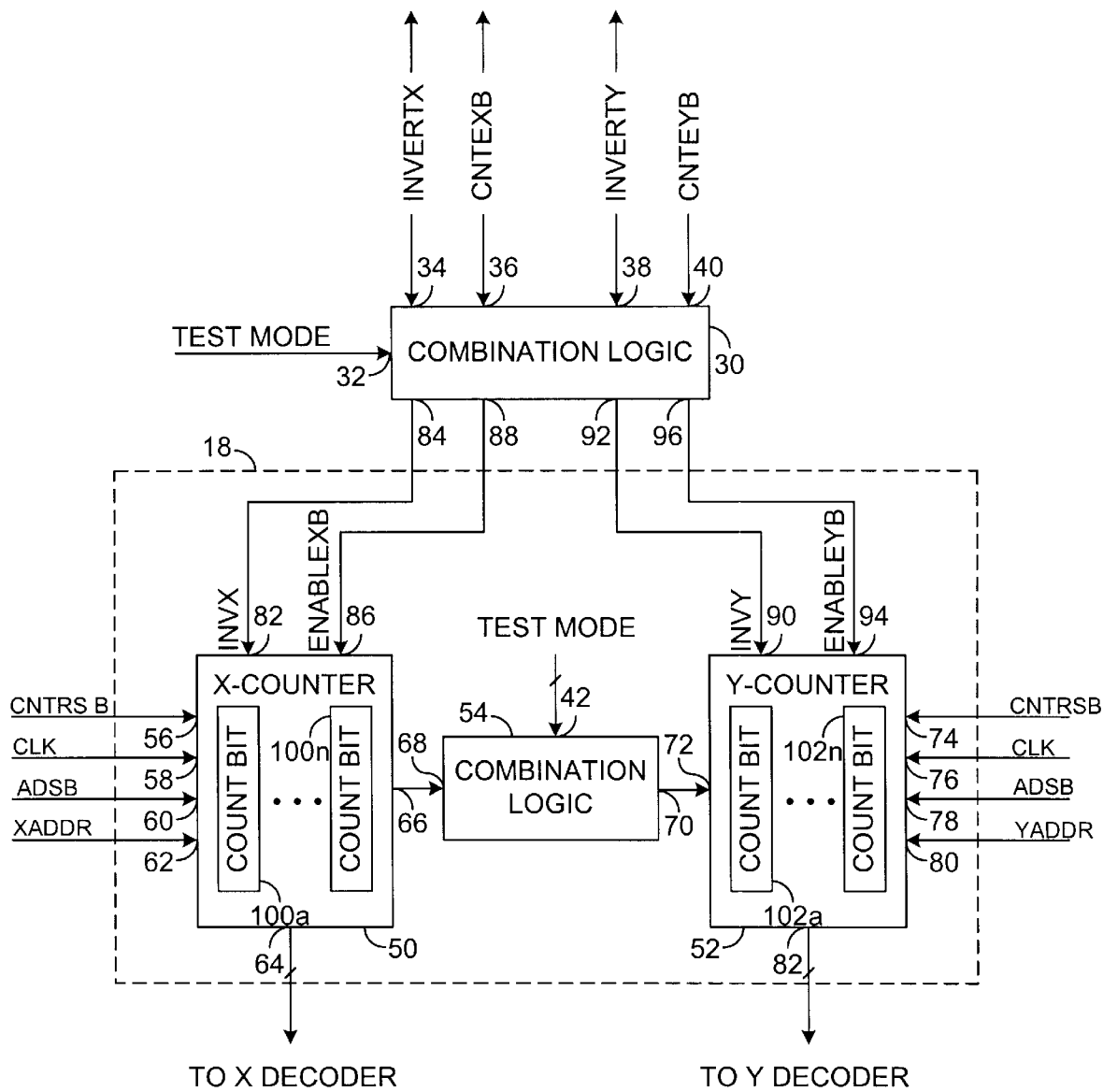
FIG. 2 is a block diagram of an implementation of the address generator of the present invention.

Referring to FIG. 2, a more detailed diagram of the counter 18 is shown along with a logic block (or circuit) 30. The logic block 30 may have an input 32 that may receive a control signal (e.g., TESTMODE), an input 34 that may receive a control signal (e.g., INVERTX), an input 36 that may receive a control signal (e.g., CNTENXB), an input 38 that may receive a control signal (e.g., INVERTY), and an input 40 that may receive a control signal (e.g., CNTENYB). The counter 18 generally comprises an X-counter 50, Y-counter 52, and a logic block (or circuit) 54. The logic block 54 has an input 42 that may receive the signal TESTMODE. The X-counter 50 may have an input 56 that may receive a control signal (e.g., CNTRSTB), an input 58 that may receive a control signal (e.g., CLK), an input 60 that may receive an address strobe signal (e.g., ADSB), and an input 62 that may receive an address signal (e.g., XADDR). The X-counter 50 has an output 64 that may present the row address signal X to the input 22 of the row decoder 16 of FIG. 1. The X-counter 50 may also comprise an output 66 that may present a carry output to an input 68 of the logic block 54.

The logic block 54 may have an output 70 that may present a carry signal to an input 72 of the Y-counter 52. The Y-counter 52 has an input 74 that may receive a control signal (e.g., the signal CNTRSTB), an input 76 that may receive a clock signal (e.g., the signal CLK), an input 78 that may receive an address strobe signal (e.g., the signal ADSB), and an input 80 that may receive an address signal (e.g., YADDR). The Y-counter 52 has an output 82 that may present the column address signal Y to the input 24 of the column decoder 14 of FIG. 1. The signals presented at the inputs 56, 58 and 60 of the X-counter 50 may be the same signals presented to the inputs 74, 76 and 78 of the Y-counter 52. The X-counter 50 may also have an input 82 that may receive a control signal (e.g., INVX) from an output 84 of the logic block 30 and an input 86 that may receive a control signal (e.g., ENABLEXB) from an output 88 of the logic block 30. The Y-counter 52 has an input 90 that may receive a control signal (e.g., INVY) that may be received from an output 92 of the logic block 30, and an input 94 that may receive a control signal (e.g, ENABLEYB) that may be received from an output 96 of the logic block 30.

The X-counter block 50 may comprise a number of counter blocks 100a–100n. Similarly, the Y-counter block 52 may comprise a number of counter-bit blocks 102a–102n. The counter-bit blocks will be described in more detail in connection with FIGS. 3 and 4.

The following TABLE 1 describes examples of various testing patterns that may be generated:

TABLE 1

| SEQUENCE # | DESCRIPTION |
|---|---|
| 0 | Counter RESET |
| 1–2 | Memory Array Diagonal |
| 3–5 | Row Ping-Pong on a single column |
| 6–8 | Address Complement Ping-Pong |
| 9 | X-fast |
| 10 | Y-fast |
| 11–13 | Decrement X |

The following TABLE 2 illustrates the various counting signals generated in response to the control signal CNTRSTB, the control signal ADSB, the control signal CNTENXB, the control signal INVERTX, the control signal CNTENYB, the control signal INVERTY, and the signal CLK.

The first column of TABLE 2 generally corresponds to the sequences defined in TABLE 1. The signals in the columns labeled X(I) and Y(I) may represent the present states of the internal address signals and the columns labeled X(I+1) and Y(I+1) are the next states of the internal address signal after the clock transition. A signal preceded by a ~ generally illustrate an inverted signal which may allow an incrementer (to be described in detail in connection with FIGS. 3 and 4) to generate a decrement sequence. An example of a decremented signal is shown in row 12, column X(I+1) as ~(X+1)=~(X)−1.

Figure 3:
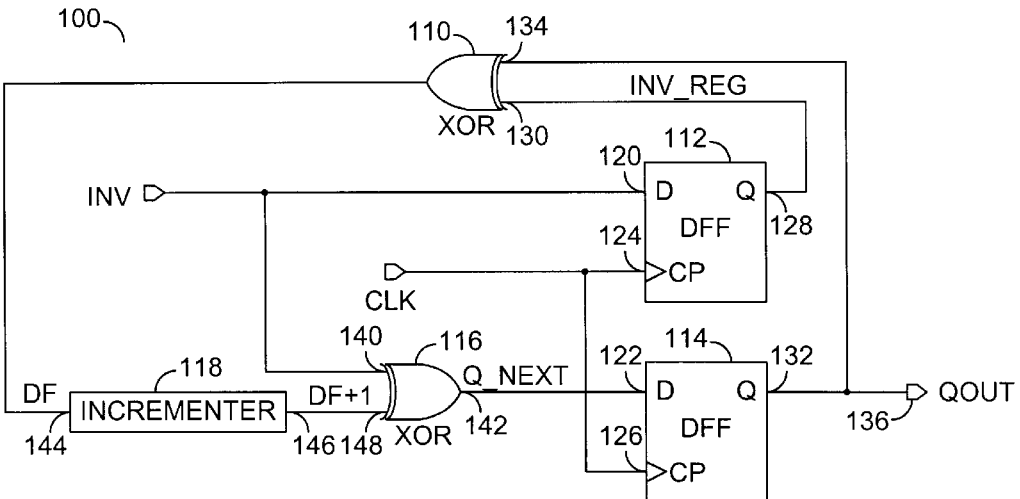
FIG. 3 is a circuit diagram of a portion of the counters of FIG. 2.

Referring to FIG. 3, an example of one of the count bit blocks 100a–100n and 102a–102n is shown in greater detail. The block 100 generally comprises an XOR gate 110, a flip-flop 112 (e.g., a memory element), a flip-flop 114 (e.g., a memory element), an XOR gate 116, and an incrementer block 118. The signal INV is generally presented to an input 120 of the flip-flop 112 as well as to an input 140 of the XOR gate 116. Depending on the implementation (i.e., either the counter-bit 100a–100n or the counter-bits 102a–102n), the signal INV may be either the signal INVX (for the X-counter 50) or the signal INVY (for the Y-counter 52). The signal CLK is generally presented to an input 124 of the flip-flop 112 as well as to an input 126 of the flip-flop 114. The flip-flop 112 generally presents a signal (e.g., INV_REG) at an output 128 that is generally presented to an input 130 of the gate 110. The flip-flop 114 may present a signal at an output 132 that may be presented to an input 134 of the gate 110 as well as to an output pin 136. The output of the XOR gate 116 may present a signal (Q_NEXT) to an input 122 of the flip-flop 114. The incrementer 118 may receive a signal from the XOR gate 110 at an input 144 and may present a signal (e.g., DF+1) at an output 146. The signal at the output 146 may be received at an input 148 of the XOR gate 116.

Figure 4:
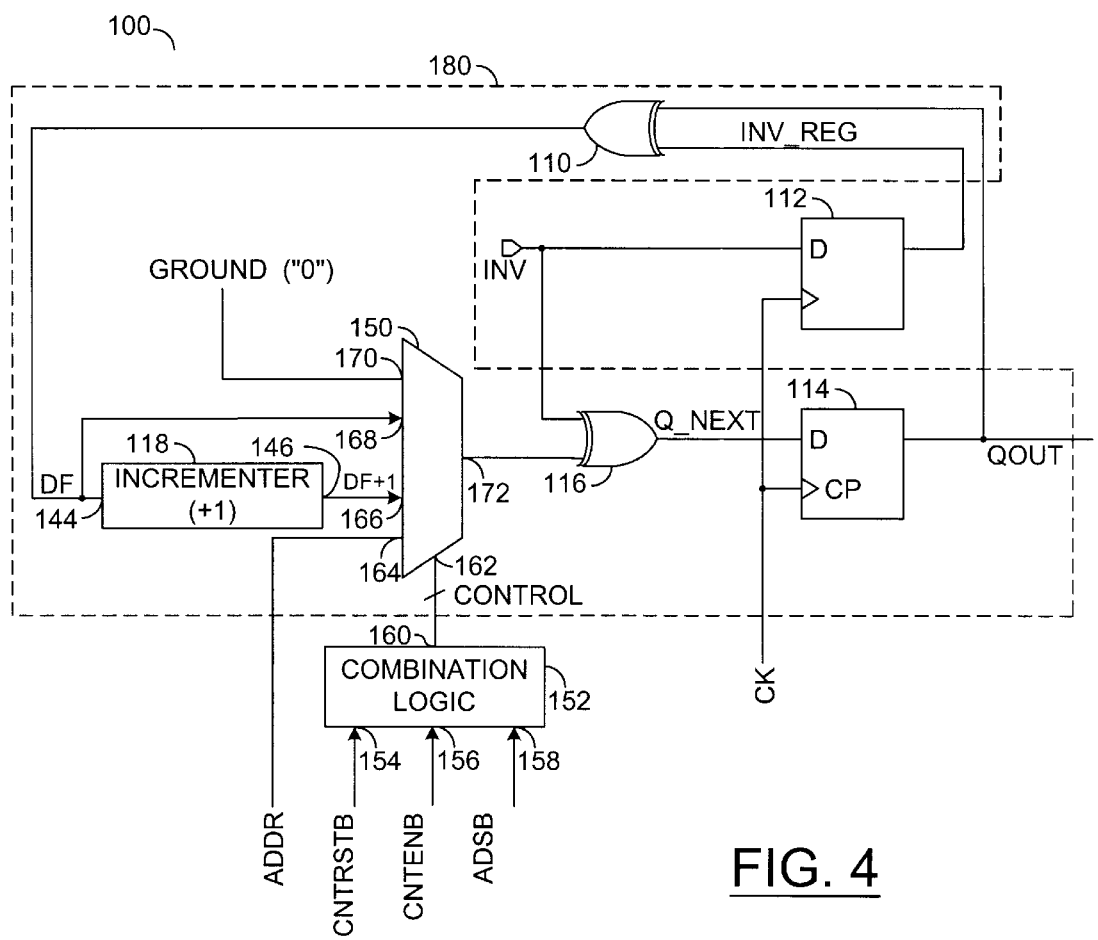
FIG. 4 is a more detailed diagram of the counter of FIG. 2 showing the test mode and normal operation mode.

Referring to FIG. 4, a more detailed diagram of the circuit 100 is shown including a multiplexer 150 and a logic block (or circuit) 152. The logic block 152 has an input 154 that may receive the signal CNTRSTB, an input 156 that may receive the signal CNTENB, and an input 158 that may receive the signal ADSB. The logic block 152 may have an output 160 that may present a control signal to an input 162 of the multiplexer 150. The control signal may be, in one example, a multi-bit signal. The multiplexer 150 may have an input 164 that may receive the external address signal ADDR, an input 166 that may receive the signal DF+1 from the incrementer 118, an input 168 that may receive the signal DF. The signal DF may also be presented to the input 144 of

TABLE 2

| Sequence # | CNTRSTB | ADSB | CNTENXB | INVERTX | CNTENYB | INVERTY | X(I) | Y(I) | X(I + 1) | Y(I + 1) |
|---|---|---|---|---|---|---|---|---|---|---|
| 0 | 0 | 1 | 1 | 1 | 1 | 1 | X | Y | 0 | 0 |
| 1 | 1 | 1 | 0 | 0 | 0 | 0 | X | Y | X + 1 | Y + 1 |
| 2 | 1 | 1 | 0 | 0 | 0 | 0 | X + 1 | Y + 1 | X + 2 | Y + 2 |
| 3 | 1 | 1 | 1 | 1 | 1 | 0 | X | Y | ~(X) | Y |
| 4 | 1 | 1 | 0 | 0 | 1 | 0 | ~(X) | Y | X + 1 | Y |
| 5 | 1 | 1 | 1 | 1 | 1 | 0 | X + 1 | Y | ~(X + 1) | Y |
| 6 | 1 | 1 | 1 | 1 | 1 | 1 | X | Y | ~(X) | ~(Y) |
| 7 | 1 | 1 | 0 | 0 | 0 | 0 | ~(X) | ~(Y) | X + 1 | Y + 1 |
| 8 | 1 | 1 | 1 | 1 | 1 | 1 | X + 1 | Y + 1 | ~(X + 1) | ~(Y + 1) |
| 9 | 1 | 1 | 0 | 0 | 1 | 0 | X | Y | X + 1 | Y |
| 10 | 1 | 1 | 1 | 0 | 0 | 0 | X | Y | X | Y + 1 |
| 11 | 1 | 1 | 1 | 1 | 1 | 1 | X | Y | ~(X) | ~(Y) |
| 12 | 1 | 1 | 0 | 1 | 1 | 1 | ~(X) | ~(Y) | ~(X + 1) = ~(X)-1 | ~(Y) |
| 13 | 1 | 1 | 0 | 1 | 1 | 1 | ~(X + 1) | ~(Y) | ~(X + 2) = ~(X)-2 | ~(Y) | the incrementer 118. An input 170 may receive a ground signal. The multiplexer 150 may present one of the signals received at the inputs 164–170 at an output 172 in response to the control signal received at the input 162. As a result, the multiplexer 150 may present the signal received at the input 166 from the incrementer 118 or the signal received at the input 168 to the output 172, when in the test mode. The multiplexer 150 may present any of the signals received at the inputs 164, 166, 168 or 170 to the output 172 when operating in the normal mode. The components inside the dotted box 180 are generally duplicated for each bit of the X-counter 50 and the Y-counter 52, respectively.

The incrementer 118 may operate in an increment mode or a decrement mode that may be controlled by the input INV, the gate 110 and the gate 116. For example, if the signal INV is a "1", the counter output may be inverted. When the signal INV is a "0", the counter output may not be inverted. The register 112 generally stores the last state of the signal INV so that the input signal DF to the input 144 of the incrementer 118 is generally not inverted. This may allow the implementation of a standard incrementer 118 for both a true and inverted counter output. The addition of the invert function to the circuit 100 does not generally impact the clock-to-out delay of the circuit 100. The timing penalty of the selective inversion, as controlled by the signal INV, may be incurred in the register-to-register delay for the circuit 100. As a result, this parameter may only impact the maximum clock frequency of the circuit 100, which generally has more timing margin than the clock-to-out delay of the circuit 100.

The test mode signal may be generated using a number of standard techniques such as using a high voltage detect pin to determine if an over-voltage signal is present. Additionally, a special sequence detection may be implemented on one of the pins of the circuit 100 to avoid the necessity of presenting a dedicated external pin. However, an external dedicated pin may be implemented in certain design implementations.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a first logic circuit configured to generate one or more control signals in response to one or more control inputs;
   a counter circuit configured to present a first counter output and a second counter output in response to (i) said control signals and (ii) one or more inputs, wherein said counter comprises a first portion configured to generate said first counter output and a second portion configured to generate said second counter output; and
   a second logic circuit configured to present a counter control signal to said first and second portions, said counter control signal configured to (i) connect said first portion of said counter with said second portion of said counter when in a normal operating mode and (ii) disconnect said first portion of said counter and said second portion of said counter when in a test mode.

2. The circuit according to claim 1, wherein said first logic circuit and said second logic circuit switch between said normal mode and said test mode in response to a test input.

3. The circuit according to claim 2, wherein said test input is entered in response to a high voltage at an input pin.

4. The circuit according to claim 1, wherein an external address is presented by said counter circuit when in said normal mode.

5. The circuit according to claim 4, wherein said counter circuit resets said first and second counter outputs in response to one of said inputs.

6. The circuit according to claim 1, wherein said first counter output is presented to a row decoder and said second counter output is presented to a column decoder.

7. The circuit according to claim 1, wherein said counter circuit comprises:
   a memory element configured to generate said first counter output in response to (i) a clock input and (ii) a first memory input;
   a first circuit configured to present said first memory input in response to (i) a memory control input and (ii) an increment input; and
   an increment circuit configured to present said increment input in response to said first counter output.

8. The circuit according to claim 7, wherein said increment input increments to a new value on each clock cycle of said clock input.

9. The circuit according to claim 8, wherein said increment input increments to a new value in further response to one or more enable inputs.

10. The circuit according to claim 7, wherein said counter circuit further comprises:
    a second memory element configured to generate an inversion signal in response to (i) said clock input and (ii) said control input; and
    a first gate circuit configured to generate said counter output in response to said inversion signal, wherein said inversion signal causes said increment input to decrement in response to each transition of said clock input.

11. The circuit according to claim 10, wherein said counter output and said inversion signal are generated in further response to a second gate circuit.

12. A circuit comprising:
    a first memory element configured to generate a counter output in response to (i) a clock input and (ii) a first input;
    a first circuit configured to present said first input in response to (i) a control input and (ii) an increment input; and
    an increment circuit configured to present said increment input in response to said counter output.

13. The circuit according to claim 10, wherein said increment input increments to a new value on each clock cycle of said clock input.

14. The circuit according to claim 12, wherein said increment input increments to a new value in further response to one or more enable inputs.

15. The circuit according to claim 12, further comprising:
    a second memory element configured to present an inversion signal in response to (i) said clock input and (ii) said control input; and
    a first gate circuit configured to generate said counter output in response to said inversion signal, wherein said inversion signal causes said increment input to decrement in response to each transition of said clock input.

16. The circuit according to claim 15, wherein said counter output and said inversion signal are generated in further response to a second gate circuit.

* * * * *